United States Patent
Bammer et al.

(10) Patent No.: US 7,535,222 B2
(45) Date of Patent: May 19, 2009

(54) MRI DATA ACQUISITION USING PROPELLER K-SPACE DATA ACQUISITION

(75) Inventors: Roland Bammer, Palo Alto, CA (US); Stefan T. Skare, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 110 days.

(21) Appl. No.: 11/619,008

(22) Filed: Jan. 2, 2007

(65) Prior Publication Data
US 2008/0157767 A1    Jul. 3, 2008

(51) Int. Cl.
*G01V 3/00*    (2006.01)
(52) U.S. Cl. .................. 324/307; 324/309; 324/310; 324/318
(58) Field of Classification Search ......... 324/306–311, 324/312–322; 600/410
See application file for complete search history.

(56) References Cited

U.S. PATENT DOCUMENTS

| | | | | |
|---|---|---|---|---|
| 6,853,189 B1 * | 2/2005 | Pipe | ............................ | 324/307 |
| 6,882,148 B2 | 4/2005 | Pipe | | |
| 7,023,207 B1 * | 4/2006 | Gaddipati et al. | ............ | 324/309 |
| 7,030,609 B2 * | 4/2006 | Pipe | ............................ | 324/309 |
| 7,102,348 B2 * | 9/2006 | Zhang et al. | ................. | 324/309 |
| 7,176,684 B2 * | 2/2007 | Patch et al. | .................. | 324/307 |
| 7,245,125 B2 * | 7/2007 | Harer et al. | .................. | 324/310 |
| 7,336,073 B2 * | 2/2008 | Patch et al. | .................. | 324/307 |
| 7,372,269 B2 * | 5/2008 | Takizawa et al. | ............ | 324/309 |
| 2005/0073303 A1 * | 4/2005 | Harer et al. | .................. | 324/307 |
| 2005/0127912 A1 * | 6/2005 | Pipe | ............................ | 324/309 |
| 2006/0232273 A1 * | 10/2006 | Takizawa et al. | ............. | 324/309 |
| 2006/0264735 A1 * | 11/2006 | Stemmer | ..................... | 600/410 |
| 2007/0001672 A1 * | 1/2007 | Patch et al. | .................. | 324/307 |
| 2007/0085539 A1 * | 4/2007 | Patch et al. | .................. | 324/309 |

OTHER PUBLICATIONS

Andersson, "How to correct susceptibility distortions in spin-echo echo-planar images: application to diffusion tensor imaging", NeuroImage 20 (2003) 870-888.
Pipe, "Motion Correction With PROPELLER MRI: Application to Head Motion and Free-Breathing Cardiac Imaging", Magnetic Resonance in Medicine 42:963-969 (1999).
Pipe et al., "Turboprop: Improved PROPELLER Imaging", Magnetic Resonance in Medicine 55:380-385 (2006).
Skare et al., "Propeller EPI in the Other Direction", Magnetic Resonance in Medicine 55:1298-1307 (2006).
Wang et al., "PROPELLER EPI: An MRI Technique Suitable for Diffusion Tensor Imaging at High Field Strength With Reduced Geometric Distortions", Magnetic Resonance in Medicine 54:1232-1240 (2005).
Skare et al., "Diffusion imaging using MinD SAP-EPI", Proceedings of the ISMRM 14th Scientific Meeting & Exhibition, Seattle, Washington, USA, May 6-12, 2006.

* cited by examiner

*Primary Examiner*—Brij B. Shrivastav
*Assistant Examiner*—Tiffany A Fetzner
(74) *Attorney, Agent, or Firm*—Beyer Law Group LLP (57) ABSTRACT

Disclosed is a new propeller EPI pulse sequence with reduced sensitivity to field inhomogeneities is proposed. Image artifacts such as blurring due to Nyquist ghosting and susceptibility gradients are investigated and compared with those obtained in previous propeller EPI studies. The proposed propeller EPI sequence uses a readout that is played out along the short axis of the propeller blade, orthogonal to the readout used in previous propeller methods. In contrast to long-axis readout propeller EPI, this causes the echo spacing between two consecutive phase-encoding (PE) lines to decrease, which in turn increases the k-space velocity in this direction and hence the pseudo-bandwidth.

9 Claims, 10 Drawing Sheets

MRI DATA ACQUISITION USING PROPELLER K-SPACE DATA ACQUISITION

STATEMENT REGARDING FEDERALLY SPONSORED RESEARCH OR DEVELOPMENT

The U.S. Government has rights in the disclosed invention pursuant to NIH Grant Nos. R01 EB002771 and P41RR09784 to Stanford University.

BACKGROUND OF THE INVENTION

This invention relates generally to magnetic resonance imaging (MRI), and more particularly the invention relates to MRI data acquisition using a propeller k-space data acquisition.

A known k-space acquisition method is Periodically Rotated Overlapping Parallel Lines with Enhanced Reconstruction, or Propeller. See, for example, Pipe "Motion Correction with PROPELLER MRI: Application to Head Motion and Free-Breathing Cardiac Imaging", MRM 1999; 42 (5): 963-969. With this method, small strips (blades) of k-space are sampled after slice excitation, with the strips successively rotated by an incremental angle until the entire k-space is sampled. The overlapping circular region of the blades around the center of k-space can be used for self-navigation and calibration.

Single-shot echo-planar imaging (ssEPI) has a leading role in many MR applications, including diffusion-weighted imaging (DWI) and functional MRI (fMRI). Its high frame rate is of particular interest for fMRI and other dynamic scans, such as perfusion-weighted MRI. For nondynamic scans (e.g., DWI), the snapshot feature of EPI is an important factor in avoiding the shot-to-shot random starting phase of each readout induced by the large diffusion gradients in concert with bulk motion. However, there are a multitude of problems associated with ssEPI. Geometric distortions could be considered as the main problem of the technique, along with many other undesired effects such as Nyquist ghosting, $T^*_2$ blurring, Maxwell effects, and eddy currents (especially for DW-EPI). The magnitude of these artifacts (aside from Nyquist ghosts) in EPI is inversely scaled by the speed with which k-space is traversed along the phase-encoding (PE) direction (i.e., the pseudo bandwidth). The pseudo bandwidth is determined by two factors: 1) the time between two consecutive echoes in the EPI readout train, and 2) the phase field of view (FOV). The latter may be decreased by the use of parallel imaging, whereby the phase FOV is reduced by a factor of R during the scan and then unfolded to the nominal phase FOV during the reconstruction process. In a similar manner, per-interleave phase FOV reduction is also obtained with interleaved EPI (iEPI). However, with interleaved EPI (in particular DW iEPI and non-DW iEPI) with severe patient motion, the phase inconsistencies between interleaves may cause problematic ghosting.

Figure 1A:
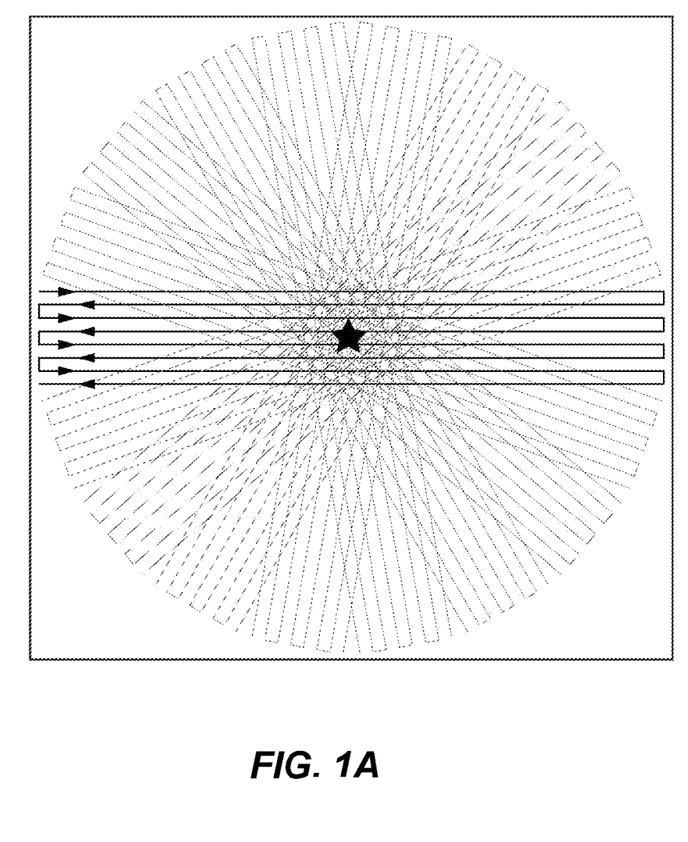
FIGS. 1a, 1b are k-Space trajectories for propeller and LAP-EPI implementations and k-Space trajectory for the SAP-EPI sequence according to the invention, pentagrams denote the center of k-space.

An alternative fast acquisition technique that is particularly suitable for DWI and is robust in the presence of patient head motion is PROPELLER (FIG. 1a). With PROPELLER the same 2D circle in the center of k-space is sampled in each readout, and thus the technique is inherently 2D navigated and able to correct for in-plane motion. Moreover, because of the RF-refocused nature of the blades in PROPELLER, the images are free from the geometric distortions present in EPI. The drawbacks of PROPELLER are that it is slower compared to EPI and is quite specific absorption rate (SAR)-intensive, which becomes an issue primarily at higher fields.

To combine the inherent 2D navigation for motion correction with EPI's rapid acquisition, the RF-refocused readout may be replaced by an EPI readout. This was recently proposed for diffusion imaging and in combination with parallel imaging. However, the off resonance sensitivity of these propeller readouts is in fact identical to a standard ssEPI sequence, since the pseudo receiver bandwidth remains unchanged. In contrast to Cartesian EPI, off-resonance distortions in propeller EPI appear as a blurring effect instead of a simple displacement of the object in the PE direction. Given this undesired blurring, former propeller EPI did not have any advantage over ssEPI because the 2D navigation of several blades can never outperform ssEPI in terms of robustness to motion. Moreover, with ssEPI, the unidirectional geometric distortions resulting from either susceptibility gradients or eddy currents may be corrected with the use of postprocessing techniques.

SUMMARY OF THE INVENTION

In accordance with the invention, a Propeller acquisition is provided which reduces echo spacing (ESP) and hence increases the speed by which k-space is traversed. This is accomplished by applying the readout direction along the propeller short-axis and the phase encoding direction along the long-axis of the propeller blades, which is opposite to what has been proposed in prior art. With Echo Planar Imaging (EPI) the geometric distortions are proportional to the ESP. In addition, typical other EPI-related artifacts, such as signal drop-out and radial blurring, are diminished by the same amount as the ESP increases using proposed orthogonal propeller EPI design. Furthermore, with the propeller EPI design proposed herein, the number of phase encoding lines rather than the number of frequency encoding lines determines the final resolution. Hence, the geometric distortions are entirely independent on the desired target resolution, which is a unique and extremely advantageous feature for our propeller EPI pulse sequence.

In accordance with a feature of the invention, parallel imaging techniques can be applied to further reduce distortions by skipping scan lines.

In accordance with another feature of the invention, a reversed gradient polarity method (RGPM), can be employed to correct the remaining geometric distortions from two oppositely acquired propeller blades.

The invention and object and features thereof will be more readily apparent from the following detailed description and appended claims when taken with the drawings.

DETAILED DESCRIPTION OF ILLUSTRATIVE EMBODIMENTS

Basic Theory for the Principal Idea

The invention will be described with reference to echo-planar imaging (EPI). For EPI, a field inhomogeneity, $\Delta B0(r)$, will cause local displacements (in [m]) of the object in the PE direction according to $$d_{pe}(r) = \frac{\gamma}{2\pi} \frac{\Delta B_0(r)}{prBW} FOV_{pe}: r = [x, y, z] \quad [1]$$

where prBW is the pseudo-receiver bandwidth defined as (ignoring gradient ramps and gaps between echoes)

$$prBW = \frac{1}{\Delta t_{pe}} = \frac{1}{T_{ro}} = \frac{1}{N_{ro}\Delta t_{ro}} \quad [2]$$

where $\Delta t_{pe}$ denotes the time between two consecutive sampling points in the PE direction, and $T_{ro} = N_{ro}\Delta t_{ro}$ is the readout time for a single echo in the EPI train, where $T_{ro}$ is echo pacing and $N_{ro}$ is resolution. Combining Eqs. [1] and [2] gives $$d_{pe}(r) = \frac{\gamma}{2\pi} \Delta B_0(r) T_{ro} FOV_{pe} = \frac{\gamma}{2\pi} \Delta B_0(r) \Delta t_{ro} N_{ro} FOV_{pe} \quad [3]$$

Since the resolution in the PE direction, Npe, is not a part of Eq. [3], it is clear that reducing the number of PE lines will not affect the geometric distortion. Given a non-zero $\Delta B_0(r)$, the geometric distortions are minimized by reducing either the phase FOV (FOVpe) or the echo spacing, $T_{ro}$, both of which affect the speed with which k-space is traversed in the PE direction. The imaged object limits the phase FOV, as aliasing is undesired. The echo spacing, $T_{ro}$, may be reduced by either increasing the receiver bandwidth $((1/\Delta_{tro}))$ or reducing the resolution, $N_{ro}$, in the frequency-encoding direction. For most EPI applications, the maximum rBW is used in combination with ramp sampling, which involves data acquisition also on the up- and downslope of the readout trapezoid, in order to minimize $T_{ro}$ within the dB/dt limits.

The invention herein further reduces the echo spacing by decreasing Nro for each propeller blade while keeping the desired PE resolution $N_{pe}$. This results in a propeller blade sampling pattern that covers an area in k-space similar to that reported in previous propeller EPI studies, but with the readout played out along the blade's short axis instead of the long axis.

As a final step in the reconstruction, the propeller blades are combined in a regridding process to a Cartesian k-space based on the correct locations in k-space corresponding to the angulation of the blades.

Current Vs. Prior Propeller-EPI Art

Figure 1B:
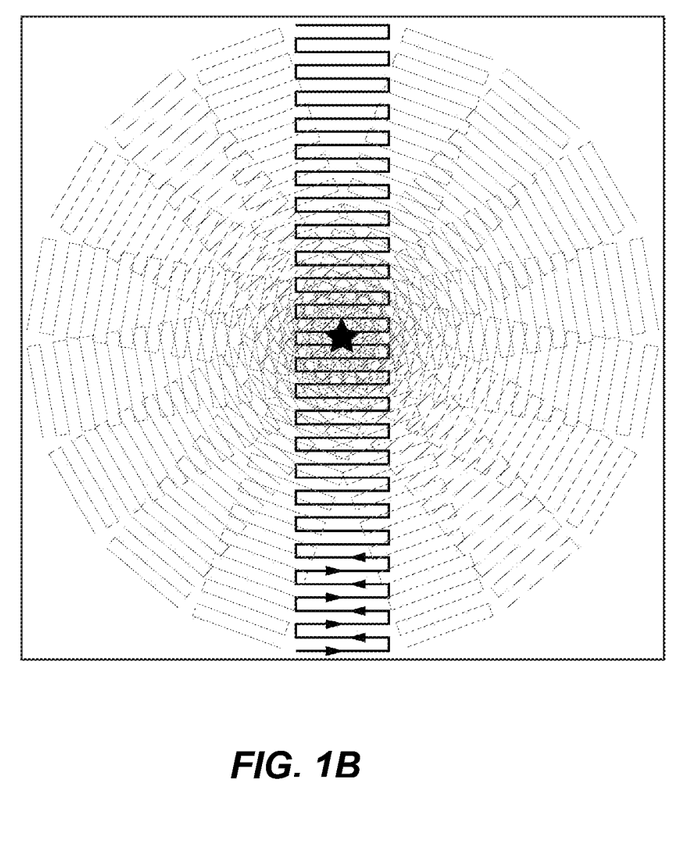

In FIG. 1a the k-space trajectory of the long-axis propeller EPI sequence according to the prior art is illustrated. Corresponding propeller blades using short-axis readouts in accordance with the present invention are depicted in FIG. 1b. For brevity, we will now refer to these two types as Short-Axis Propeller (SAP)-EPI and Long-Axis Propeller (LAP)-EPI. In SAP-EPI, $k_{max}$, and therefore the image resolution, is determined by the number of PE lines. Since the number of PE steps does not have any impact on the pseudo bandwidth (Eq. [3]), increasing the resolution in SAP-EPI should be decoupled from additional artifacts, except for some additional $T^*2$ decay due to longer total readout time.

Figure 2A:
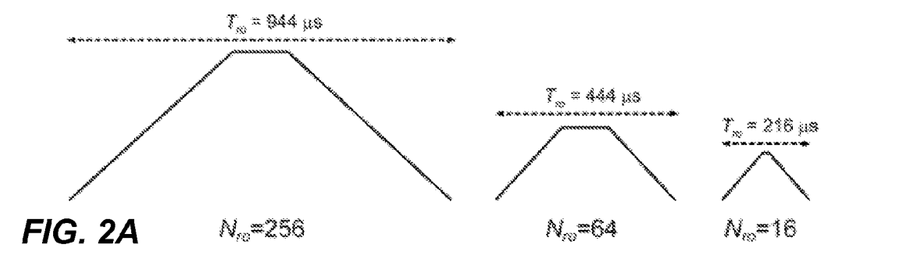
FIGS. 2a-2c are (a) trapezoidal readout gradients of the EPI train for three frequency-encoding resolutions ($N_{ro}$=256, 64, 16), (b) Echo spacing, $T_{ro}$, which is proportional to the geometric distortions, decreases with $N_{ro}$ and (c) Lower Nro makes the readout less efficient, and without diffusion weighting, the minimum TR per slice is approximately given by the product of the ETL [ms] and the number of blades required to fill k-space; this plot shows that for $N_{ro}$ lower than about 30, the minimum TR and hence the scan time are increased considerably; for DW scans, the scan time penalty is even higher.
Figure 2B:
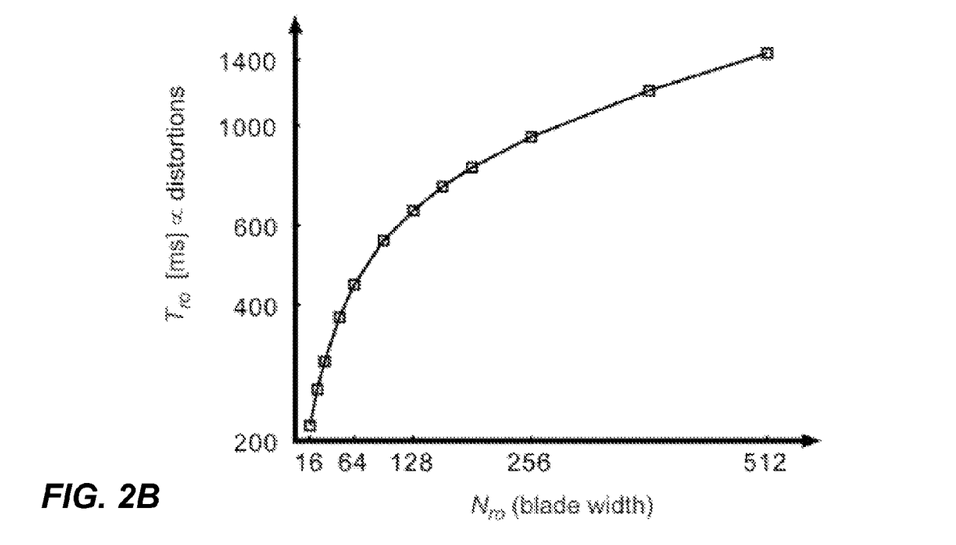
Figure 2C:
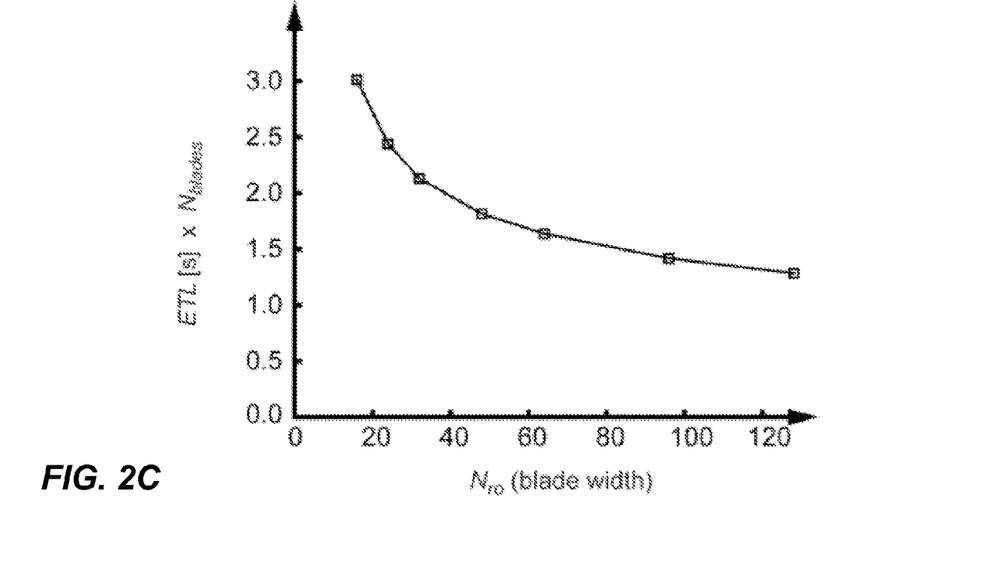

Theoretical Geometric Distortions as a Function of $N_{ro}$ for Ramp-Sampled Acquisitions For ramp-sampled EPI acquisitions, k-space is traversed along $k_{ro}$ at a variable speed, which causes the simple relationship between $\Delta_{tro}$ and $T_{ro}$ given in Eq. [2] to no longer hold. For small $N_{ro}$, the majority of sampling is done during the ramps of the readout trapezoid. While smaller $N_{ro}$ is desirable to minimize the geometric distortions (Eq. [3]), there are diminishing returns for very narrow blades because the kro velocity is reduced. For an FOV of 24×24 cm and our particular gradient performance, we show in FIG. 2a three readout gradients with different $N_{ro}$'s. For $N_{ro}=16$, the echo spacing is almost entirely dependent on the slew rate of the system because the maximum gradient amplitude is never reached. As a result of current vendor's dB/dt safety limitations, both the slew rate and the readout gradient amplitude are limited differently for various $N_{ro}$'s. These limitations dictate that the readout may not consist of ramps alone, which gives an asymptotic lower bound to Tro. Given these limitations, the relationship between $T_{ro}$ and $N_{ro}$ is plotted in FIG. 2b for our MR system. As for any propeller-based sequence, narrower blades require also more blades to fully cover k-space. Because of the increased sampling during the ramps for low $N_{ro}$, the echo train is not shortened enough to compensate for the increased number of blades, which leads to increased scan time. In FIG. 2c the y-axis represents the echo train length (ETL, given in [s])×$N_{blades}$, which is equivalent to the minimum TR per slice or normalized scan time for a minimum TE and half Fourier scan. One can see that the scan time penalty is moderate until $N_{ro}$ goes below 30. For diffusion weighted imaging (DWI), where the minimum TE is on the order of 50-100 ms due to the extent of the diffusion gradients, the situation is quite different. Since in such a situation the readout time (ETL) is only a fraction of the total sequence time, the increased scan time might be an issue for very narrow blades.

TE and Half-Fourier Imaging

As illustrated in FIG. 1b (SAP-EPI), the k-space center (denoted by a pentagram) is reached later in time compared to FIG. 1a (LAP-EPI). This would make the TE increase for SAP-EPI, which might reduce the SNR or change the tissue contrast. A half-Fourier acquisition is used to resolve this issue. To fully cover k-space, one may either do a full 360° sweep of the half-Fourier propeller blades, which requires twice the scan time, or (as implemented here) sweep 180° and reconstruct each blade with a half-Fourier reconstruction technique like e.g. POCS. After half-Fourier reconstruction of a single blade, one can obtain a blade image at full resolution in the PE direction. In order to align the k-space peaks, some kind of phase correction is typically needed for each blade image prior to Fourier transforming it back to k-space, which results in a full-size blade centered in k-space. In this way the TE in SAP-EPI becomes generally shorter compared to that in the LAP-EPI method.

Image Artifacts Scales with $N_{ro}$-Simulations

Figures 5A, 5B, 5C, 5D, 5E:
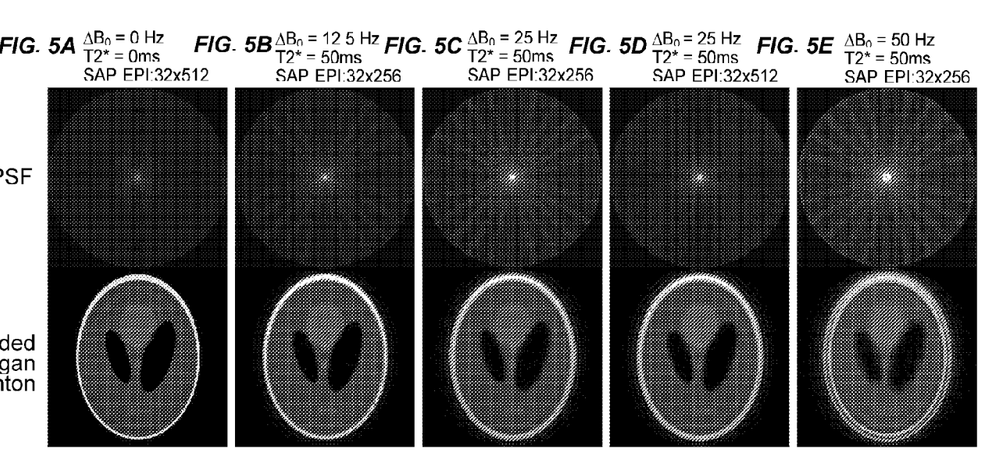
FIGS. 5a-5i are simulations with a Shepp-Logan phantom. Synthetic k-space data were generated by inverse regridding using an 8× grid for maximum accuracy. a: Regridded phantom without $T_2^*$ or off-resonance effects using same regridding routine as for all data in this work. (b-e) SAP-EPI and (f-i) LAP-EPI at different resolutions and off-resonance levels.
Figures 5F, 5G, 5H, 5I:
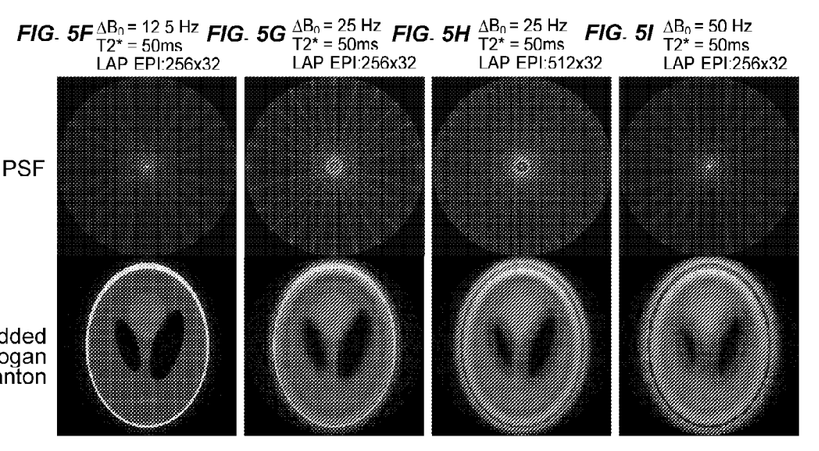
Figure 6A:
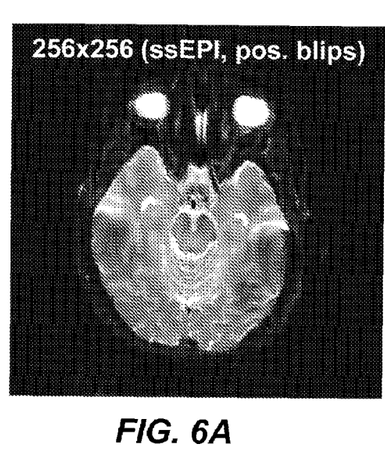
FIGS. 6a-6e are a: 256×256 ssEPI (positive blips). b: 256×256 ssEPI (negative blips). c: 256×32 LAP-EPI. d: 32×256 SAP-EPI. e: Fat-saturated FSE as reference.
Figure 6B:
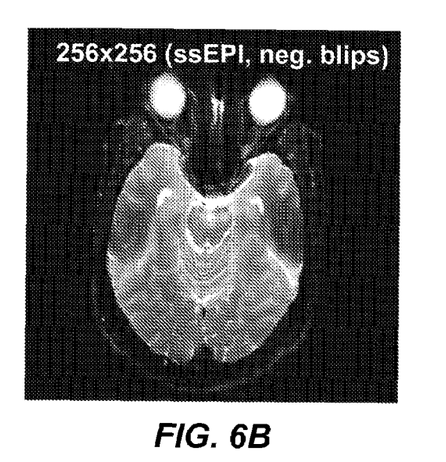
Figure 6C:
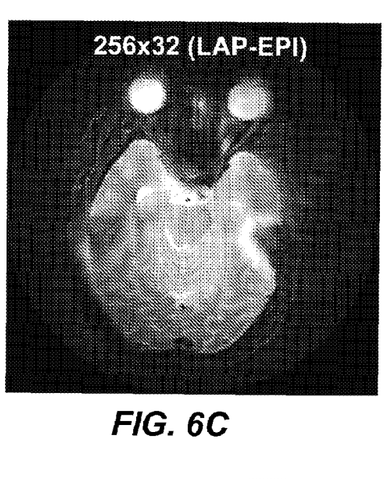
Figure 6D:
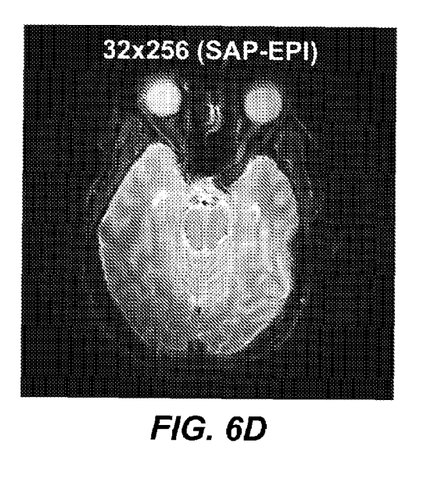
Figure 6E:
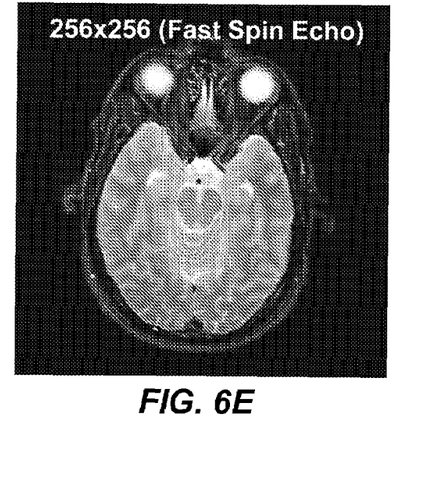

These results are further supported by the simulations outlined in FIG. 5. In FIG. 5a the regridded Shepp-Logan phantom and its corresponding point spread function (PSF) without any $T^*_2$ decay or off-resonance artifact, $\Delta B_0$, are shown for reference. The other panels show SAP-EPI (b-e) and LAP-EPI (f-i) for $\Delta B_0$ of 12.5, 25, and 50 Hz. The 25 Hz is shown at target resolutions of both 256 (c and g) and 512 (d and h). Except for the small off-resonances in FIGS. 5b and f, where the LAP-EPI may even have an advantage, one can see that the image quality is substantially more degraded due to blurring for LAP-EPI. Moreover, one can also appreciate the local circular "motion" artifacts of the object in SAP-EPI, shown in FIG. 5, by looking at both the PSF and the images in FIG. 5b-e. The PSF's for SAPEPI are also more localized than those for LAP-EPI, which makes the final image that is convolved with the PSF less blurred. One of the key points in this paper is that, in contrast to LAP-EPI, the distortions do not scale with target resolution for SAP-EPI. Evidence for this is given for the $256^2$ and $512^2$ target resolution images in FIGS. 5c and d that are identical with regard to distortions for SAP-EPI. The corresponding $512^2$ LAP-EPI data in FIG. 5h are prone to substantially more blurring compared to the $256^2$ image in FIG. 5g. We also observed the effect of $T^*_2$ alone on the two sequences, and found that the broadening of the PSF due to $T^*_2$ can be neglected in the presence of realistic off-resonance levels (data not shown).

Image Artifacts Scales with $N_{ro}$—Actual Data

Figure 3A:
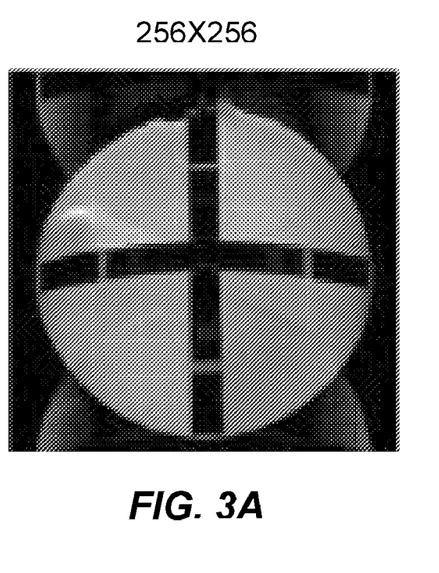
FIGS. 3a-3c are a: 256×256 ssEPI. b: 256 (freq.) 40 (phase) ssEPI. c: 40 (freq.) 256 (phase) ssEPI, images a-c were acquired with positive PE blips.
Figure 3B:
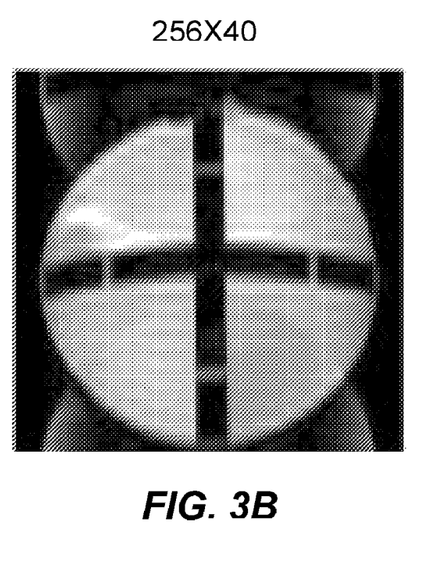
Figure 3C:
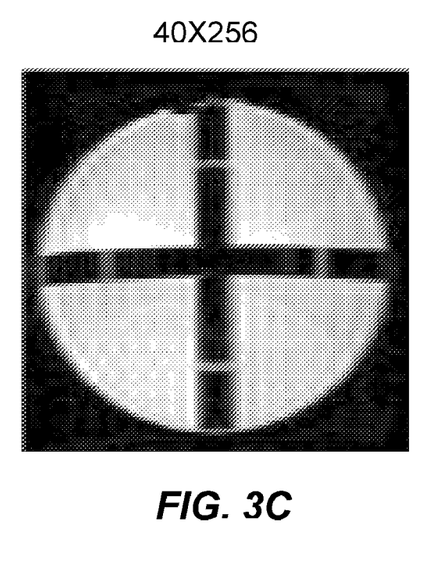
Figure 4A:
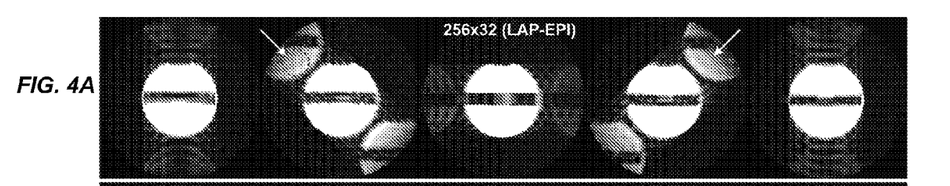
FIGS. 4a-4d are residual ghosting as a function of the blade angle with reconstructed blades for five different angles are shown (0°, 45°, 90°, 135°, 180°) and for four different values of $N_{ro}$ ((a) 256, (b) 64, (c) 32, and (d) 16), keeping the target resolution at 256×256, FIG. 4e) illustrates relative ghost intensity.
Figure 4B:
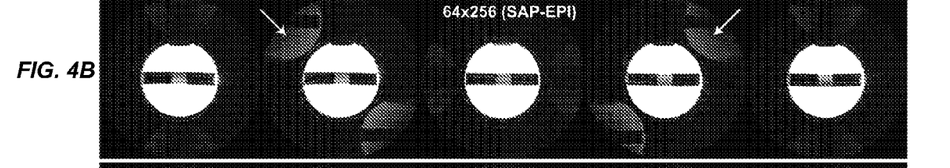
Figure 4C:
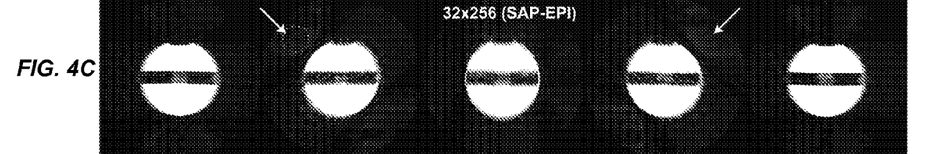
Figure 4D:
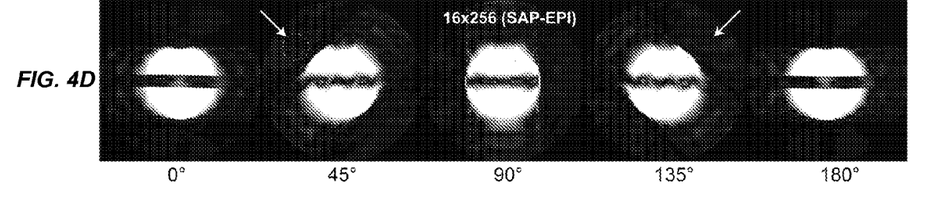
Figure 4E:
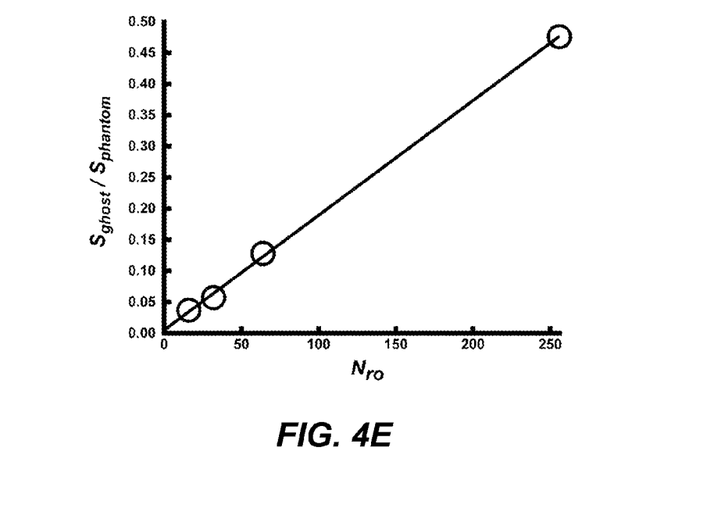

In FIGS. 3a-3c the single-shot 256×256 (freq.×phase encoding), 256×40, and 40×256 echo-planar images of a phantom experiment is shown 20-cm-diameter water phantom. The 256×40 image corresponds the readout trajectory of a LAP-EPI propeller blade with $N_{pe} \ll N_{ro}$, whereas the 40×256 (freq.×phase) image correspond to a SAP-EPI propeller blade with $N_{ro} \ll N_{pe}$. As outlined in the Theory section, FIGS. 3a and 3b are equally distorted, since distortion is determined only by the frequency-encoding resolution, $N_{ro}$. Furthermore, the residual ghosting level in 3a and 3b (after conventional ghost correction) is virtually identical, which is reasonable since the odd/even echo timing and $G_{ro}$ are the same. In FIG. 3c the geometric distortion is only 36% of that in FIGS. 3a and b according to FIG. 2b and Eq. [3]. This is evidence that the individual blade of SAP-EPI are less distorted than LAP-EPI and normal Cartesian EPI.

Ghosting Scales with $N_{ro}$

In FIG. 4, the residual ghosting characteristics (post conventional ghosting correction) for in individual blade images from five propeller-EPI acquisitions with different blade sizes are shown. Whatever is left as ghosting in each blade will translate into blurring in the final regridded image, why low ghosting in each individual propeller blade is important. The blade sizes shown in FIG. 4 are 256×32 (freq.×phase, i.e. LAP-EPI), 64×256, 32×256, 16×256 (freq.×phase, i.e. all three SAP-EPI). Data for propeller blade angles (left to right); 0°, 45°, 90°, 135°, 180° are shown. Each blade image was resampled using the same gridding procedure employed for the full propeller data set. For the blade angles of 0°, 90°, and 180° the logical and physical image axes coincide, which allows standard ghost correction techniques (that operate in the $k_{ro}$ direction) to work satisfactorily regardless of $N_{ro}$. The most ghost-prone blade angles are 45° and 135°, in which the logical readout is driven equally by the physical x and y gradients. For these angles the $k_{pe}$ shifts are most significant. However, the residual ghosting (white arrows) for the troublesome angles becomes less and less of an issue as $N_{ro}$ decreases, which is advantageous for the SAP-EPI sequence. This is because the residual (non-correctable) EPI Nyquist ghosts scale with the amplitude of the readout gradient, which is lower for SAP-EPI. The relative ghost level was measured from the dotted circled ROIs in FIG. 4a-d and the mean signal in the phantom. This is plotted vs. $N_{ro}$ in FIG. 4e, which shows a linear dependence.

Scan Time Vs. Distortions

Smaller $N_{ro}$ yields less distortion at the expense of a larger number of blades required to fill k-space, resulting in longer scan times. Moreover, smaller $N_{ro}$ implies that there is less common area between the blades, which may impair the 2D motion correction feature and phase correction capabilities because the spatial resolution in the image domain will become too low for these corrections. Hence there is a lower limit that $N_{ro}$ can have in practice.

Non-Diffusion Weighted MR-Data from Volunteer Using Current Vs. Prior Art

A slice just superior to the auditory canals of the volunteer is displayed in FIG. 6. In the top panel the two 256×256 ssEPI images are shown, which are sampled with positive (FIG. 6a) and negative (FIG. 6b) phase encoding blips. The geometric difference between these two images corresponds to that for the first and last LAP-EPI blades. This gives an impression of how different the apparent anatomy may be between the blades for the 256×32 LAP-EPI, shown in FIG. 6c. Evidently, the effective image resolution and signal intensity drop dramatically, except in the posterior part of the brain, which is an area of small field inhomogeneities. With the 32×256 SAP-EPI (FIG. 6d), the image quality is greatly improved compared to FIG. 6a-c. Compared to an FSE image (FIG. 6e), the 32×256 SAP-EPI (FIG. 6d) demonstrates only moderate blurriness and tissue displacements.

Diffusion Weighted MR-Data from Volunteer Using Current Vs. Prior Art

Figure 7A:
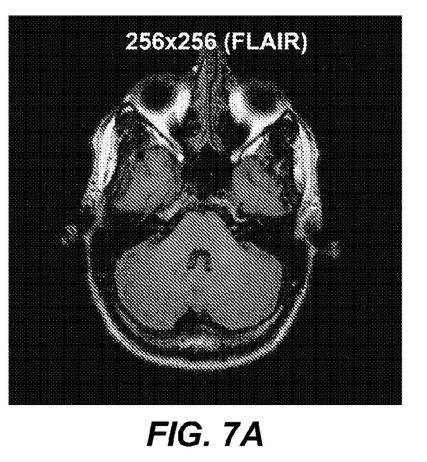
FIGS. 7a-7d are (a) FLAIR image for reference onto which an automated contour was drawn and copied to b-d. b: 256×256 DW-ssEPI. c: 256×32 DWLAP-EPI. d: 32×256 DW-SAP-EPI.
Figure 7B:
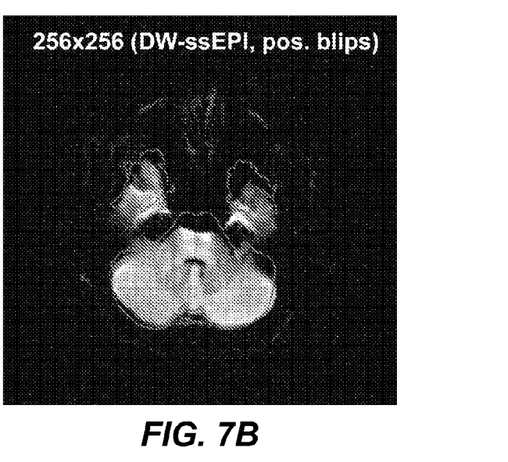
Figure 7C:
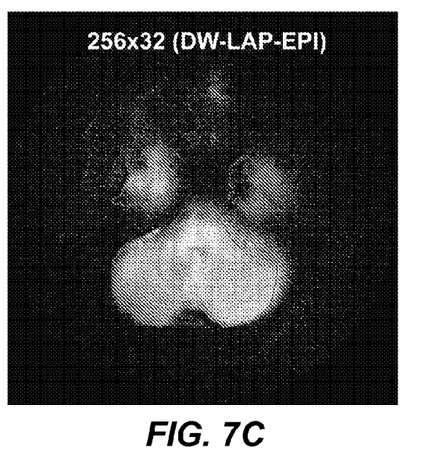
Figure 7D:
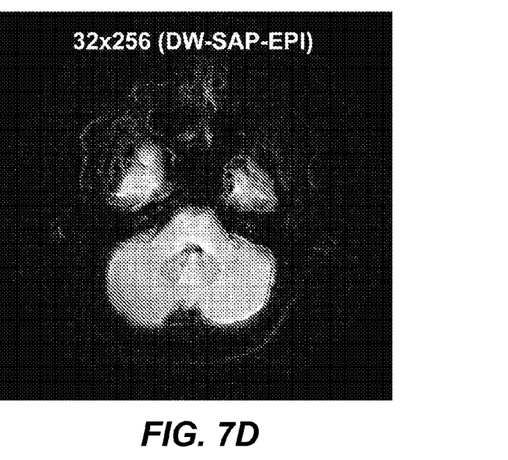

In addition, DW images for a slice 15 mm lower than that in FIG. 6 are presented in FIG. 7b-d. b=1000 s/mm², applied in the S/I (through-plane) direction only. The FLAIR image is given as geometric reference in FIG. 7a. On this image a contour was automatically drawn in red around the brain structures with the use of the imcontour function in MATLAB (The Mathworks, Natick, Mass., USA). These contours were transferred to FIG. 7b-d to allow a pixel wise comparison of the geometry for ssDW-EPI (FIG. 7b) using positive phase blips, DW-LAP-EPI (FIG. 7c), and DW-SAP-EPI (FIG. 7d). The image artifacts are dramatically reduced in FIG. 7d compared to FIGS. 7b and 7c at this low slice location. The EPI readout times became 30.2, 43.2, and 135.9 ms for the LAP-EPI, SAP-EPI, and ssEPI acquisitions, respectively.

RF Heat Deposition and Scan Time Efficiency Comparisons

In Table 1 some key acquisition parameters are given for DW propeller, LAP-EPI, and SAP-EPI on our 1.5 T and 3 T systems. Some observations can be made from this table, as follows:

1. The minimum TE is 20-30% lower for SAP-EPI compared to LAP-EPI and PROPELLER on both field strengths.
2. Compared to SAP-EPI, the minimum TR (to fit 15 slices using b=1000 s/mm$^2$) is 17.5% and 33% higher for LAP-EPI at 1.5 T and 3 T, respectively. While ideally LAP-EPI has a more efficient readout due to less ramp sampling, as a result of the vendor's built-in gradient heating calculations the TR increases. The scan time increases proportionally.
3. SAR is close to the limit for PROPELLER at 1.5 T. At 3 T the minimum TR is automatically increased in order to not exceed the SAR limitations set by the vendor. The SARs of both LAP-EPI and SAP-EPI are four to 10 times lower than the SAR limit, depending on the field strength used.
4. While the sequence timing dictates a doubled scan time for PROPELLER compared to SAP-EPI, the increased TR due to SAR makes the scan time four times longer at 3 T.

An increase in the number of phase encoding lines (i.e. blade width) for PROPELLER from 16 to 24 has also been evaluated (data not shown). This was less favorable for the PROPELLER sequence since the minimum TE increased by 30% from 106.2 ms to 137.1 ms, which reduced SNR. Our preliminary benchmarking tests with DW-LAP/SAP-EPI and PROPELLER on 1.5 T and 3 T indicate that the SAR level is an order of magnitude less for LAP/SAP-EPI, which is also promising for imaging at higher fields, such as 7 T. Moreover, the final scan time may be two or four times less for SAP-EPI compared to PROPELLER at 1.5 T and 3 T, respectively. For non-DW scans, the difference in echo spacing of about 25 times between SAP-EPI and PROPELLER will make the scan time difference even more pronounced. Alternatively, the promising Turbo-prop sequence with mixed gradient and RF refocused readouts may be used; however, that sequence was not available to the inventors.

Enhancements of the Technique 1-Parallel Imaging

Figure 8A:
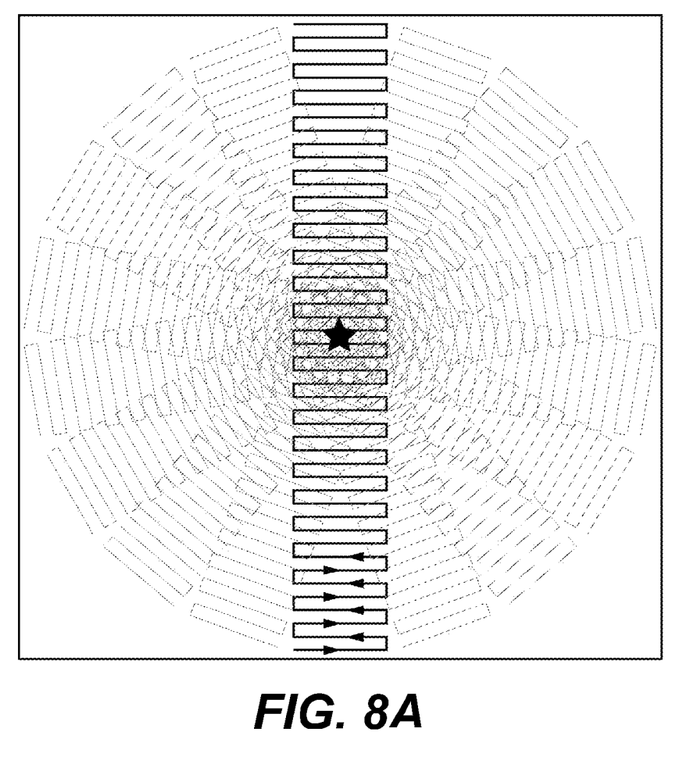
FIGS. 8a, 8b illustrate use of parallel imaging in accordance with the invention.
Figure 8B:
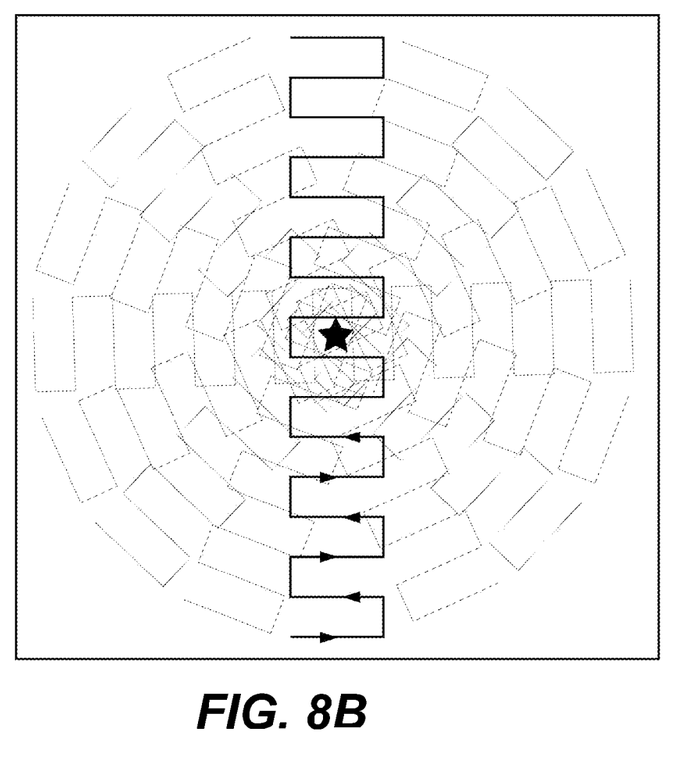

Instead of decreasing $N_{ro}$ much below about 16-32, we believe that additional distortion reduction can be achieved by parallel imaging (PI) techniques, which would increase $\Delta k_{pe}$ by a factor of R. Combining SAP-EPI with a realistic acceleration factor of 3 on a conventional eight-channel RF-system would reduce the image artifacts by about a factor of 9 for a clinically relevant target resolution of 256×256. In FIGS. 8a and 8b, the k-space trajectory for a non-accelerated and PI-accelerated SAP-EPI blade is shown, respectively. Several PI techniques may be used, e.g. SENSE (Pruessmann, K. P. et al. SENSE: Sensitivity Encoding for fast MRI, Magn Reson Med, 42(5):952-62, 1999), GRAPPA (Griswold M, Generalized autocalibrating partially parallel acquisitions (GRAPPA), Magn Reson Med, 47(6):1202-10, 2002), ARC (Brau A. et al., ISMRM 14$^{th}$ annual meeting, Seattle 2006, pp. 2462) etc. Common for all is that the PI calibration information must be obtained either in the image, hybrid-space or k-space domain. For SAP-EPI thus far, this PI calibration data has been obtained independently for each blade. However, this PI calibration data may also be obtained for SAP-EPI by using the oversampled region in the intersecting regions from all (R times undersampled) blades. That is, despite each blade is undersampled, the missing $k_{pe}$ lines can be synthesized with parallel imaging using the densely sampled central k-space region as PI calibration without the need for an external calibration scan.

Enhancements of the Technique 2-Distortion ($\Delta B_0$) Correction

Figure 9:
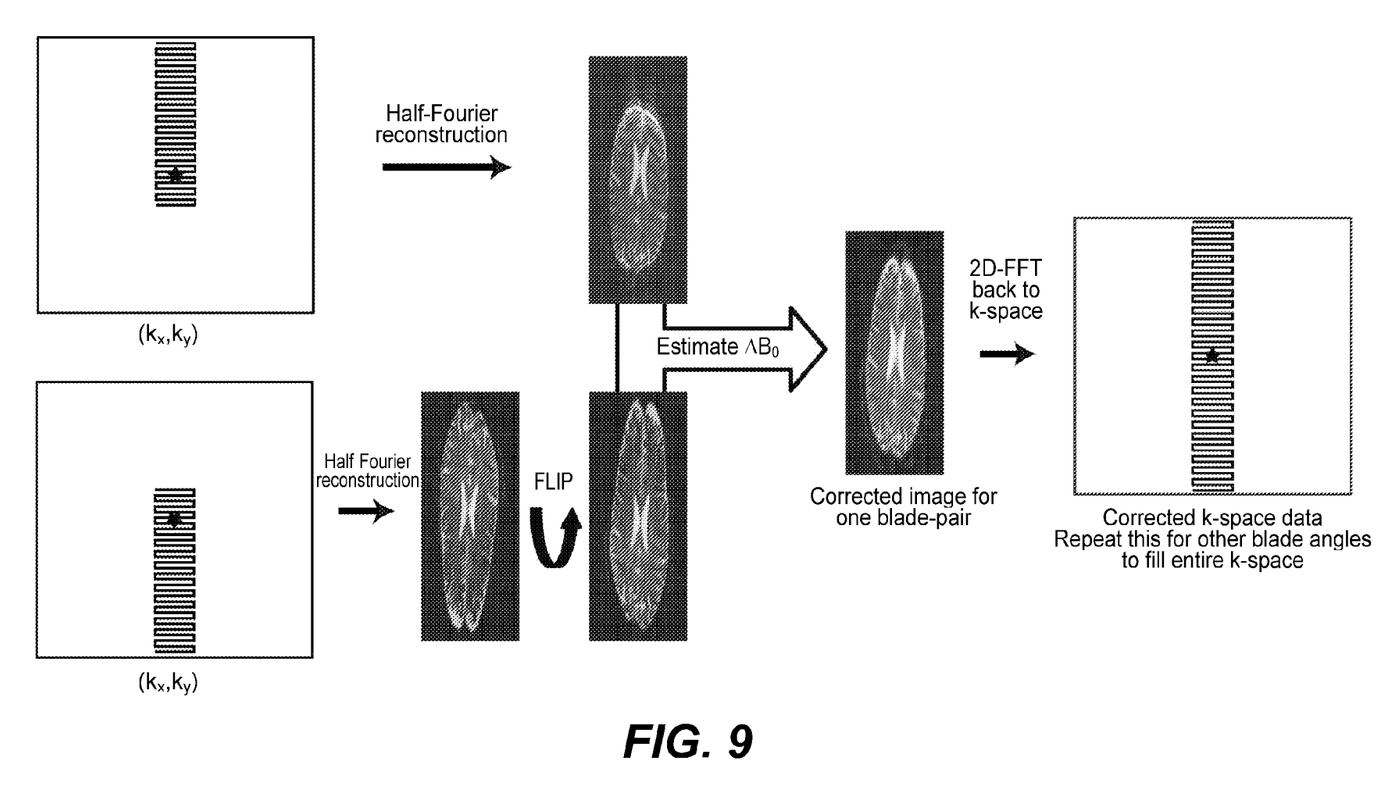
FIG. 9 illustrates use of reversed gradient polarity in accordance with the invention.

Additionally, a reversed gradient polarity method (RGPM), such as disclosed by Anderson, Skare, and Ashburner, NeuroImage 20 (2003), pp 870-888, can reduce geometrical distortions between tissues of differing magnetic susceptibility. RGPM uses two magnitudes images that are acquired with opposite k-space traversal. The underlying unknown field inhomogeneity can be estimated and corrected by minimizing the difference between the two images. Following our SAP-EPI acquisition disclosed herein, propeller blades that are oriented 180° relative to each other may be undistorted this way. Patient motion that may have occurred between blade pairs will also be modeled and corrected with this approach. In practice, all blades involved in the scan can be processed this way, leading to a full set of rectified blades that will be used in the final regridding and reconstruction. This is illustrated in FIG. 9. The drawback of the opposite blade pair approach is that blades covering angles from 0° to near 360° are required for the acquisition, which is twice that needed (0°-180°) to form a final image without distortion correction. Possible variations (that avoid this) of the opposite blade approach includes:

a) Blades are acquired over 0°-near 180°. One common $\Delta B_0$ field in the patient coordinate system is estimated from all

TABLE 1

|  | 1.5 T | | | 3 T | | |
| --- | --- | --- | --- | --- | --- | --- |
|  | propeller | LAP-EPI | SAP-EPI | propeller | LAP-EPI | SAP-EPI |
| Frequency hase | 256 × 16 | 256 × 32 | 32 × 256 | 256 × 16 | 256 × 32 | 32 × 256 |
| # Of blades[a] | 34 | 17 | 17 | 34 | 17 | 17 |
| Min. TE (msec)[b] | 90.5 | 90.1 | 65.6 | 106.2 | 92 | 73.4 |
| Min TR (msec)[c] | 4700 | 4700[e] | 4000[f] | 7500 | 4000 | 3000 |
| Scan time[d] | 5:06 | 2:49 | 2:24 | 8:04 | 2:24 | 1:48 |
| SAR (W/kg) | 1.5 | 0.20 | 0.23 | 1.8[g] | 0.53 | 0.70 | blades together in their native blade frame of reference. Similar to the original approach, the $\Delta B_0$ field to be estimated is found by minimizing the difference between the blades. This time, the difference between all acquired blades is taken into account and rotated versions of the $\Delta B_0$ field needs to be applied to each blade (in its own Cartesian frame of reference).

b) Blades are acquired over 0°-near 180°, but an extra blade is read out after the same excitation, directly following the first one, likely with an RF refocusing pulse in between the two readouts. The only difference would (again) be the direction which they are read out, allowing for distortion correction using the original RGPM method.

c) Blades are acquired over 0°-near 180°, twice. By changing TE slightly between two repetitions, a $\Delta B_0$ field could be calculated via phase difference methods following phase unwrapping. This does not reduce the scan time, but may be found useful.

The $\Delta B_0$ field estimated using current, variation a-c or any other technique may either be applied on the blades in image domain or by phase rewinding the effect of the $\Delta B_0$ field along the blade readout trajectory in k-space.

Enhancements of the Technique 3-Dual/Multi Propeller-Blades per Excitation

Instead of reading out one propeller blade per excitation, two or more blades (at different angles) may be acquired after the same excitation. For optimal performance, a refocusing pulse may be added between each blade readout (except for the last one). However, there may be applications where refocusing pulses are not needed.

Figure 10:
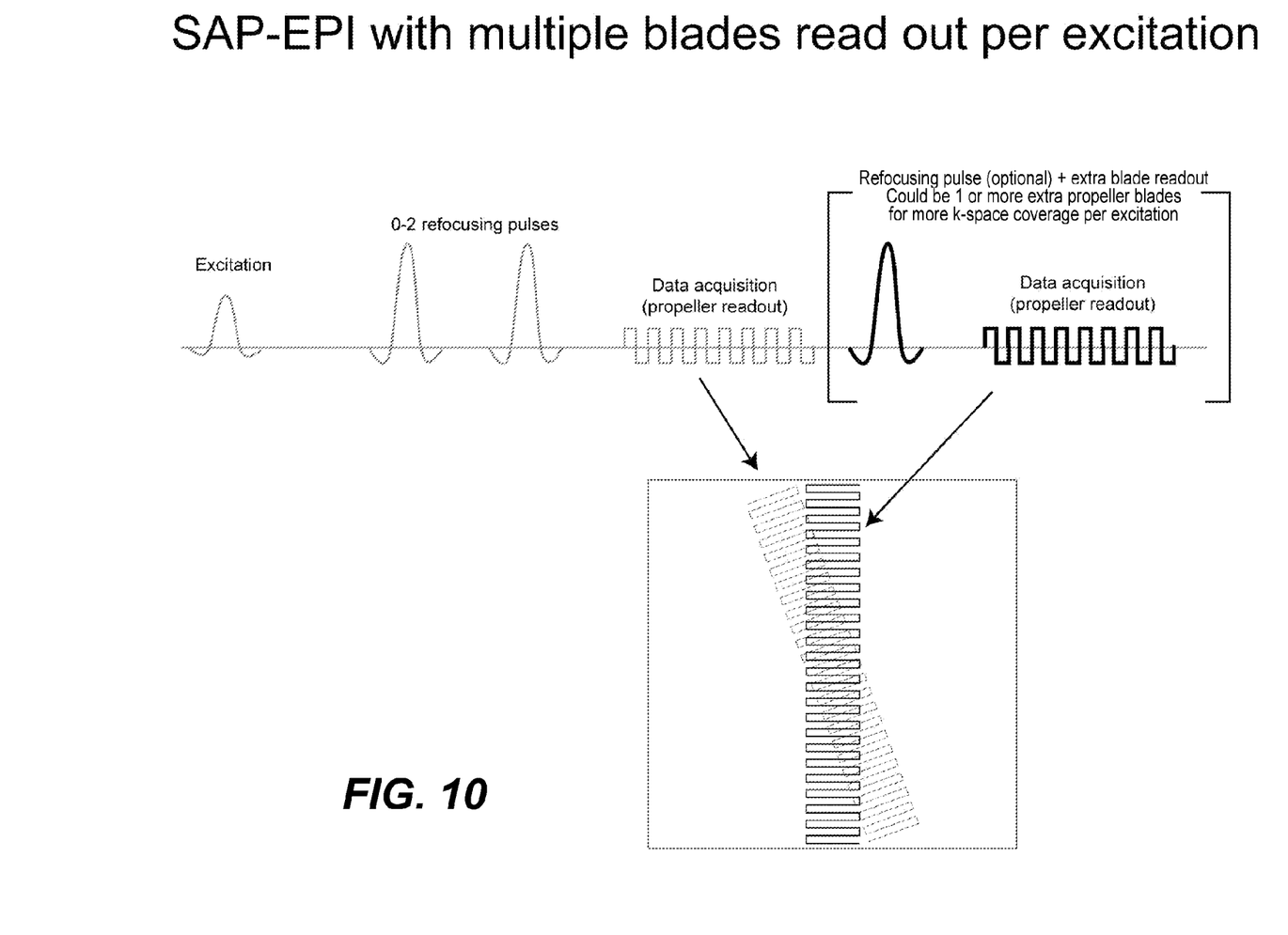
FIG. 10 illustrates use of a plural of EPI-readouts to acquire multiple blades per excitation in accordance with a feature of the invention.

Multiple blade readouts can shorten the total acquisition time, in particular for e.g. diffusion weighted PI accelerated SAP-EPI, where the diffusion preparation time is in the order of 40-100 ms followed by an blade readout of about 10-30 ms. One or two extra blades can provide a better balance between the prep time and the readout period(s). This is illustrated in FIG. 10.

While the invention has been described with reference to specific embodiments, the description is illustrative of the invention and is not to be construed as limiting the invention. Various applications may occur to those skilled in the art without departing from the spirit and scope of the invention as defined by the appended claims.

Attached hereto and incorporated by reference for all purposes is the paper by Skare et al. "Propeller EPI in the Other Direction", Magnetic Resonance in Medicine 55:1298-1307 (May 2006).

What is claimed is:

1. A method of magnetic resonance image data acquisition comprising the steps of:
   a) exciting a slice to be imaged,
   b) reading out signals from the excited slice in a swath in k-space having the long axis of the acquired swath (a.k.a. blade) aligned with a phase encoding direction and with a plurality of spaced readout lines aligned with the short axis of the swath (frequency encoding direction);
   c) repeating steps a) and b) for a swath in k-space that is rotated relative to previous swaths; and
   d) generating and displaying at least one magnetic resonance image from the read out signals.

2. The method of claim 1 wherein final resolution is determined by the number of phase encoding lines, whereby geometric distortions are independent of desired target resolution.

3. The method of claim 1 wherein each swath is read out as an EPI trajectory.

4. The method of claim 1 wherein a plural of swaths are read out after the same excitation.

5. The method of claim 1 wherein in step b) the distortion is further reduced by increasing spacing between the readout lines in the phase encoding direction.

6. The method of claim 5 wherein the missing k-space data between readout lines are synthesized via the use of Parallel Imaging.

7. The method of claim 6 wherein slice excitation and signal readout utilize Propeller.

8. The method of claim 7 wherein geometric distortions are further reduced by using reversed gradient polarity in combination with acquired propeller blade data.

9. The method of claim 7 wherein geometric distortions are further reduced by applying a previously calculated field inhomogeneity map to the propeller blade data in one of k-space and image domain.

* * * * *